United States Patent [19]

Rodriguez-Cavazos

[11] Patent Number: 4,961,032
[45] Date of Patent: Oct. 2, 1990

[54] DUAL POWER SOURCE OUTPUT AMPLIFIER

[75] Inventor: Enrique Rodriguez-Cavazos, Indianapolis, Ind.

[73] Assignee: RCA Licensing Corporation, Princeton, N.J.

[21] Appl. No.: 291,831

[22] Filed: Dec. 29, 1988

[51] Int. Cl.⁵ .................... H01J 29/70; H01J 29/76
[52] U.S. Cl. ........................... 315/397; 315/395
[58] Field of Search ........................ 315/395, 396, 397

[56] References Cited

U.S. PATENT DOCUMENTS

| | | | |
|---|---|---|---|
| 3,859,557 | 1/1975 | Grant et al. | 315/395 |
| 4,289,994 | 9/1981 | Beaumont et al. | 315/397 |
| 4,484,111 | 11/1984 | McMorrow, Jr. et al. | 315/397 |

*Primary Examiner*—Theodore M. Blum
*Attorney, Agent, or Firm*—Joseph S. Tripoli; Joseph J. Lakes; Harvey D. Fried

[57] ABSTRACT

A dual power source output amplifier comprises at least one pair of first and second input voltage sources of like polarity, operating at low and high voltage magnitude levels respectively relative to one another, and selectively operably coupled to an output stage for driving a load, for example a convergence yoke coil, in low and high voltage modes respectively. The first voltage input source is coupled to the output stage in the low voltage mode. A circuit for directly sensing the output voltage couples a biasing voltage level to the output signal for generating a high voltage demand control signal which varies directly with the output voltage. A switchable voltage regulator couples regulated high voltage from the second voltage input source to the output stage in the high voltage mode, responsive to the high voltage demand control signal. The output stage operates substantially linearly in both voltage modes. The first voltage input source is isolated from the second voltage input source during operation in the high voltage mode. High power demand is directly sensed and anticipated to preclude operational power output lags.

22 Claims, 6 Drawing Sheets

DUAL POWER SOURCE OUTPUT AMPLIFIER

This invention relates generally to the field of dual power source output amplifiers capable of operating in low and high voltage power modes, and in particular, to dual power source output amplifiers for driving deflection coils, for example, in convergence yokes of cathode ray tubes.

Cathode ray tubes used in televisions are subject to distortions of the video image on the cathode ray tube faceplate raster. Such distortions include east-west pin distortion, north-south pin distortion, horizontal nonlinearity and vertical nonlinearity. Projection television instruments, which require a mechanical alignment between three cathode ray tubes, not only magnify those raster distortions otherwise present on the cathode ray tube faceplate raster, but add new distortions as well. These include horizontal and vertical trapezoid distortion, skew and bow. The projected image is highly distorted, at best, if left uncorrected. The problem of correcting these distortions is especially difficult. The distortions present for each of the three colors is different because the cathode ray tube to screen alignment for each color is different.

In order to correct these distortions, projection television instruments are normally provided with an auxiliary deflection yoke for each of the three cathode ray tubes. These auxiliary deflection yokes are commonly referred to as convergence yokes.

The coils of the convergence yokes are necessarily excited with appropriate current waveforms for correcting the images on the projection screen. Such waveforms typically consist of combinations of vertical and horizontal rate parabolas and ramps and the product of such parabolas and ramps. Each of the three cathode ray tubes requires a horizontal coil and a vertical coil in its convergence yoke. Since the amplitudes and shapes of the correction waveforms needed to excite each of the six coils in the three deflection yokes is different, six independent output amplifiers are required. Each of the output amplifiers must take as an input voltage a low voltage level waveform generated by a convergence waveform generator, and produce as an output a current in the corresponding convergence coil which is proportional to such voltage and of sufficient power to drive the coil.

A projection television set may typically be operated at a 1H horizontal rate of 15,734 Hertz, in an interlaced scanning pattern wherein each image frame is generated by two successive vertical scans of 262½ lines each. The voltage supply requirements for displacing the beam during scanning are markedly different during the trace and retrace intervals of each horizontal scan. The impedance of a convergence coil during retrace is mainly inductive. Power consumption during retrace is therefore mainly reactive rather than dissipative. Nevertheless, a very large quantity of current must flow through the coil during retrace, and in a direction opposite to current flow during trace. Moreover, the current flow cannot take place instantaneously. Accordingly, a high voltage must be applied to drive the coil during retrace. However, when such high driving voltages are also applied during the much longer trace interval, considerable energy is wasted by heat dissipation.

Convergence yoke operation involves the following considerations. Firstly, the waveforms required to excite each coil are significantly different from one another. Secondly, the output voltage is relatively low during the active scan time and approaches the supply voltage only during the horizontal retrace time. Thirdly, for any given amplifier, the output voltage may approach only one of the supply voltages, either positive or negative, but not both.

The choice of supply voltages for convergence output amplifiers must be made by taking into consideration the fastest change of convergence current necessary and the convergence coil inductance. As the amplifiers used are typically class B amplifiers, a significant amount of power is dissipated in the output devices because the output voltage is significantly lower than the supply voltage during most of the waveform period, that is, during the active scan portion rather than the retrace portion.

The images of projection television instruments are often of higher quality when the frames are not produced according to the interlaced scanning method at the 1H rate, but by the progressive scanning method, where the full 525 lines are scanned without interlacing. This requires horizontal deflection at twice the rate, as twice the number of horizontal lines must be scanned in the same time period, namely 1/60th of a second. Such double scanning rate operation is often referred to as 2H scanning.

When the maximum allowable time for retrace is decreased, as in the case of a 2H projection television instrument, the amount of power dissipated by the amplifier during trace increases significantly, as the supply voltage needed to achieve retrace must increase accordingly. The power dissipation is on the order of 60 watts for a 2H projection television instrument, which unnecessarily burdens the power supply and mandates large heat sinks in the output devices.

A dual power source output amplifier in accordance with an inventive feature significantly reduces the power dissipation in output convergence amplifiers by utilizing two different power supplies during distinctly different portions of the waveforms, that is, during trace and retrace, respectively. A low voltage power supply is used when the necessary output voltage is relatively low and a high voltage power supply is available when a rapid change in output current mandates a high driving voltage.

The specific power dissipation in the output stage of any particular convergence amplifier depends on the actual current waveform, but it is estimated that power convergence output amplifiers according to this invention may dissipate approximately one-half the power which would otherwise be dissipated by a conventional design with a typical output waveform. Not only are smaller heat sink areas necessary to prevent unacceptable temperature rise in the output amplifiers, but the power supply requirements themselves are reduced, a very significant consideration for a 2H design. Additional efficiencies and cost reductions may be obtained by appreciating that none, only one or at least only a small number of the amplifiers is likely to need to provide an output voltage which approaches both the positive and negative high voltage supply levels. The output stages of the remaining amplifiers may be asymmetrical, thus reducing the complexity of the amplifier circuits.

Dual power source amplifiers, also known as dual supply amplifiers, are known. However, they do not provide a regulated voltage for the transistors in the output stage to preclude saturation during retrace. Further, they do not provide for automatic switching between the low and high voltage supplies, or sources, by directly sensing the output voltage level and generating a high voltage demand control signal by coupling a D.C. level directly to the output voltage signal. Moreover, they do not vary the level of high voltage actually applied to the output stage in accordance with the output signal. Varying the voltage applied to the output stage in accordance with the output signal assures that the level of high voltage actually applied to the output stage does not exceed a predetermined magnitude in excess of the output signal, which substantially precludes saturation of the output stage and the impaired switching characteristics resulting from saturation. If the output stage saturates during retrace, there may not be enough time for the output stage to return to linear operation by the time the next trace interval begins, particularly during 2H scanning. Moreover, the concept of providing substantial efficiencies in design, cost and operation of dual power source amplifiers, with respect to the need for symmetric and asymmetric amplifiers, has not been applied to convergence yokes or projection television instruments.

The invention may be advantageously embodied in a dual power source amplifier comprising at least one linear gain stage for generating an output signal, coupled to a first voltage source in a low voltage mode of operation, and switchably coupled to a second voltage level source of a higher magnitude than the first voltage source and of like polarity to the first voltage source. A circuit monitors the output signal and generates a high voltage mode or demand control signal. The need for operation in the high voltage mode may be anticipated by combining the output signal and a predetermined voltage level, for example, by summing, and comparing the sum to a second predetermined voltage level source. The second predetermined voltage level source may be related to or correspond to the level of the first voltage source. A voltage regulator is coupled to the monitoring circuit, coupled between the second voltage level source and the at least one gain stage in a high voltage mode of operation responsive to the control signal. The voltage regulator applies high voltage to the at least one gain stage, the regulated high voltage varying directly with the output signal and maintaining substantially linear operation of the at least one gain stage in the high voltage mode. The voltage regulator may be modulated by a signal corresponding to the sum of the output signal and a predetermined voltage level coupled thereto, the predetermined voltage level being developed by the monitoring means. The monitoring means thereby anticipates high voltage demand by comparing the sum to a second predetermined voltage level, which may correspond to the level of the first voltage source.

In order to process bipolar signals, the amplifier may further comprise a third voltage level source, of a polarity opposite to the polarity of the first and second voltage level sources, coupled to the at least one gain stage in both the low and high voltage modes. In order to process bipolar signals having large magnitude excursions of both polarity, the amplifier may comprise a third voltage level source also coupled to the at least one linear gain stage for operation in the low voltage mode of operation and a fourth voltage level source of a higher magnitude than the third voltage level source and of like polarity to the third voltage level source. In this configuration, the monitoring circuit may anticipate high voltage demand by separately combining, for example by summing, the output signal with each of first and second predetermined voltage levels and comparing the sums to first and second predetermined voltage levels. The first and second predetermined voltage levels may be, for example, the levels of the first and third voltage level sources which are coupled to the at least one gain stage in the low voltage mode. The voltage regulator may comprise first and second regulator stages, coupled respectively between the two high magnitude voltage sources and the at least one gain stage. Inasmuch as the signal being processed will not undergo simultaneous positive and negative polarity excursions, only one of the high magnitude high voltage sources will be coupled to the at least one gain stage at a time.

It is a further advantage of the invention that the various monitoring circuits and voltage regulators or stages may be embodied with a small number of components, as compared to existing dual source amplifiers.

Figure 1:
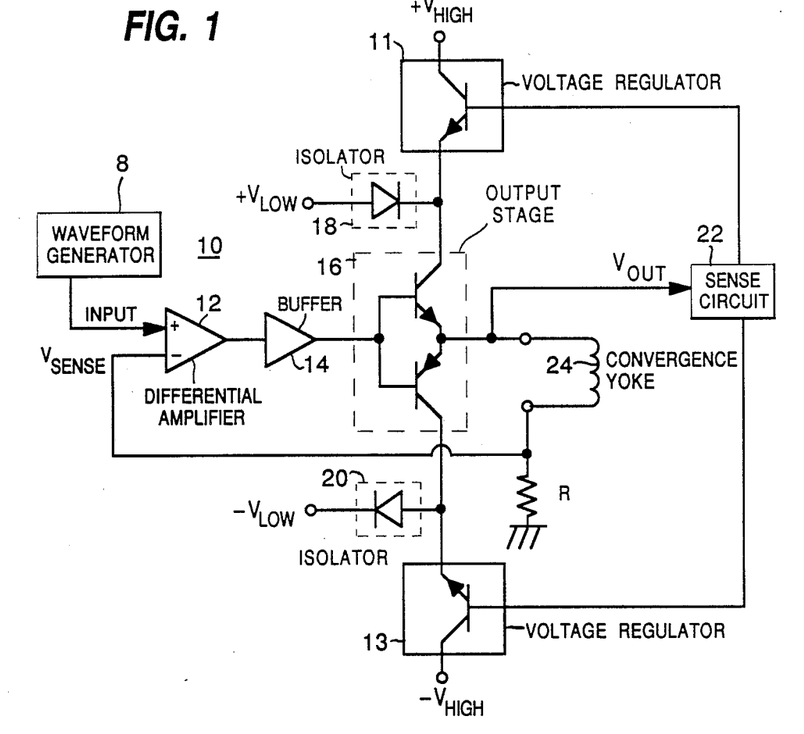
FIG. 1 is a block diagram of a source of dual supply output amplifier according to this invention.

A dual power source or supply convergence output amplifier 10 is shown in block diagram form in FIG. 1. The amplifier is suitable for a correction waveform for driving a deflection coil, for example, in a convergence yoke. An input voltage, in the form of a deflection correction waveform, is connected to the noninverting input of a differential amplifier 12. The waveform may be supplied by waveform generator 8. Waveform generator 8 may be of conventional design and is not shown in detail. The inverting input of differential amplifier 12 is connected to a current sense resistor R which is in series with deflection coil 24 of a convergence yoke. The voltage developed across the sense resistor R is a sense voltage $V_{SENSE}$. The output of the differential amplifier 12 is a regulated voltage proportional to the error between the input voltage and the output current. The regulated voltage is routed through a buffer 14 and fed as an input to a class B output stage 16. Output stage 16 is shown as comprising at least one linear gain stage.

Output stage 16 receives power from two sets of voltage supplies. Each set comprises first and second input voltage sources of like polarity, operating at low and high voltage magnitude levels, respectively, relative to one another. These are represented in FIG. 1 as $+V_{LOW}$ and $+V_{HIGH}$, and $-V_{LOW}$ and $-V_{HIGH}$, respectively. The actual values of the low and high voltage sources may vary according to circuit, signal and load requirements.

A sense circuit 22 detects the output voltage driving the convergence coil. When the output voltage exceeds a predetermined value, the sense circuit switches on either of two voltage regulators 11 and 13 to couple a larger magnitude supply voltage to the output stage. Operation in the low voltage mode takes place when the output signal is in a first range of voltage magnitude levels. Operation in the high voltage mode takes place when the output signal is in a second range of voltage magnitude levels larger in magnitude than the voltage levels in the first range.

Circuits or circuit elements 18 and 20 are provided for isolating the lower supply voltage lower sources from the higher voltage supply sources when the higher voltage supply source has been connected to the output stage. This can be accomplished by the use of diodes, as shown. The power dissipation of such an amplifier is significantly lower than a conventional design, because the lower and higher values of the different supplies can be chosen independently of one another. The high voltage determines, and is therefore a design function of, the maximum change in current necessary for a given retrace time and yoke impedance. On the other hand, the lower supply voltage may be optimized for minimum power dissipation during the active scan or trace time. Moreover, the sense circuit provides a control signal to the voltage regulator to vary or modulate the level of high voltage actually applied to the at least one gain stage, to assure linear response. Such control may be provided by a transistor, as illustrated.

The amplifier 10 shown in FIG. 1 is at least balanced, and may be designed as to be completely symmetric. As noted, most of the output amplifiers needed for driving a set of convergence coils need not be symmetric or even balanced. Rather, it is likely that only one or the other of the high voltage power supplies is necessary. Such an unbalanced amplifier 30 is illustrated in block diagram form in FIG. 2.

Figure 2:
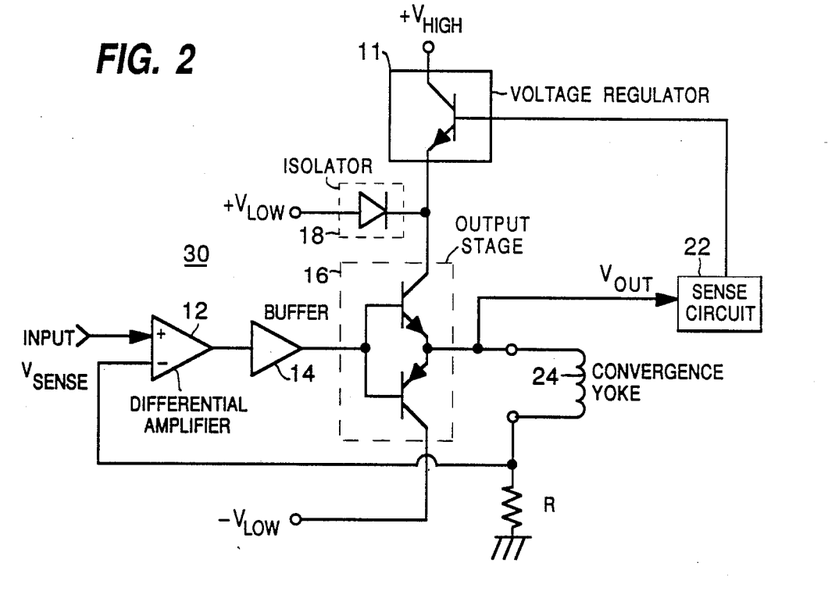
FIG. 2 is a block diagram of an alternative embodiment of the amplifier shown in FIG. 1.

As like reference numerals indicate, the amplifier 30 comprises a differential amplifier 12, a buffer 14 and an output stage 16. The output voltage is measured by a sense circuit 22 for controlling a voltage regulator 11. However, in this unbalanced configuration there is no need for a negative polarity high magnitude voltage source. Accordingly, switching between low and high voltage power supplies occurs only during positive excursions of the output voltage. Whereas switchable voltage regulator 11 will affect a reasonably regular alteration between first and second voltage sources of a like polarity, a third input voltage source $-V_{LOW}$ of an opposite polarity to the first and second input voltage sources will be coupled to the output stage in both voltage modes. It will be appreciated by those skilled in the art that an unbalanced design may just as well eliminate the need for a positive polarity high voltage input source, and provide for switching between lower and higher magnitude voltage sources of negative polarity.

Figure 3:
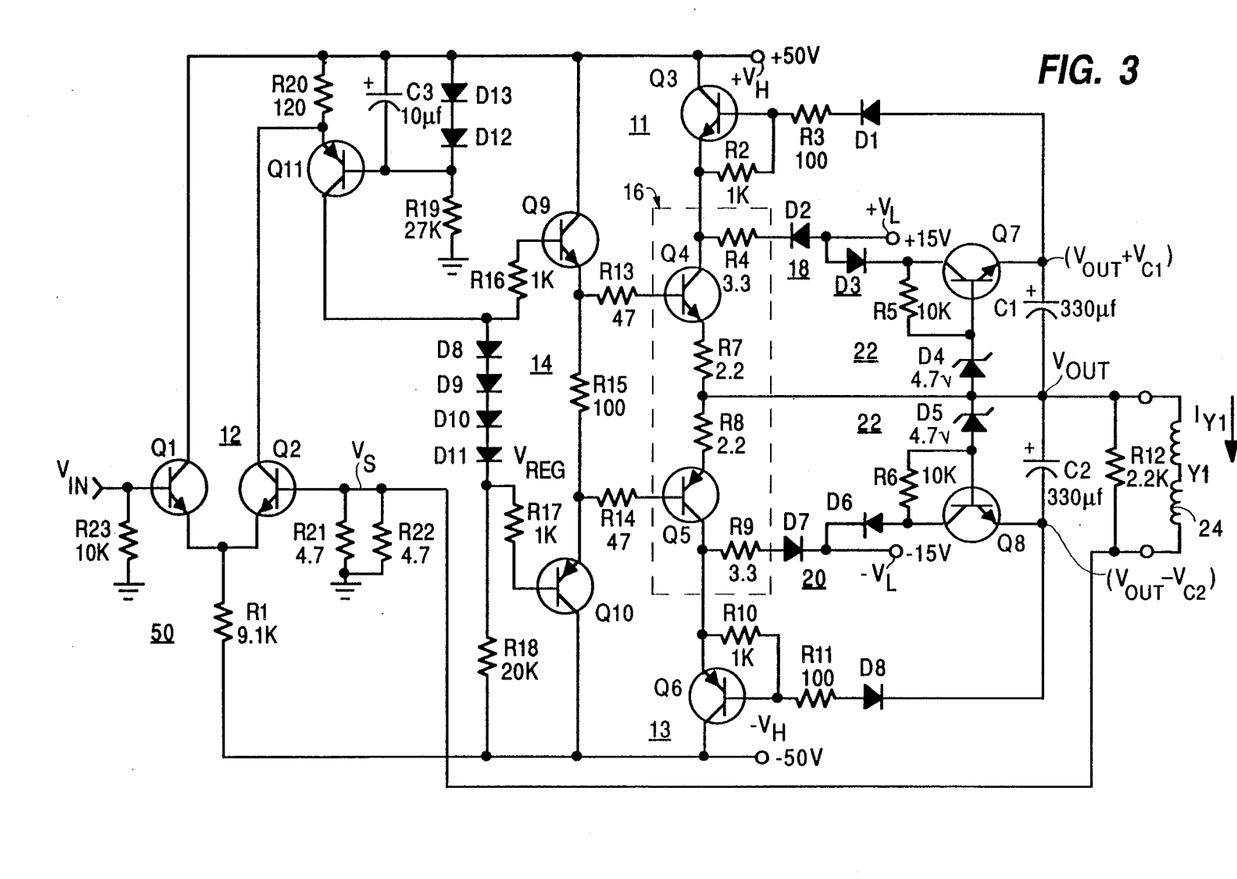
FIG. 3 is a circuit diagram for implementing the amplifier shown in FIG. 1.

A circuit schematic for a dual supply output amplifier in accordance with the block diagram of FIG. 1 is shown in FIG. 3. The illustrated circuit design is a balanced, symmetric dual supply output amplifier. The symmetric, dual supply amplifier 50 comprises a differential amplifier 12, a buffer 14, at least one output stage 16, a sense circuit 22 for controlling each high voltage supply, and means 18 and 20 for isolating the low voltage supplies from the high voltage supplies.

More particularly, the differential amplifier 12 is formed by transistors Q1 and Q2. Alternatively, an integrated differential amplifier may be used. The input waveform signal source $V_{IN}$ is connected to the base of transistor Q1. The collector of transistor Q1 is connected to the high voltage supply source of positive polarity $+V_H$, which for a 2H design may be 50 volts as shown. The emitters of transistors Q1 and Q2 are connected together, and through resistor R1, to the negative high voltage supply $-V_H$, which for a 2H design may be set for $-50$ volts as shown. A sense resistor is formed by the parallel combination of resistors R21 and R22, which are connected to the deflection coil 24 of yoke Y1 and the base of transistor Q2, for developing the sense voltage $V_S$. Transistor Q11 converts the output current at the collector of transistor Q2 into an output voltage across the load resistor R18. This output voltage corresponds to a regulated voltage $V_{REG}$. Diodes D8, D9, D10 and D11 establish a biasing voltage for the buffer stage 14, which includes transistors Q9 and Q10. The emitters of transistors Q9 and Q10 of the buffer stage drive the bases of transistors Q4 and Q5, respectively, through resistors R13 and R14, respectively. Transistors Q4 and Q5 form at least one class B output stage 16. The emitters of transistors Q4 and Q5 are connected to resistors R7 and R8, respectively. The output voltage signal of the amplifier is generated at the junction of resistors R7 and R8, which is connected to the coil 24 of convergence yoke Y1.

The output stage 16 is powered by two sets of voltage sources which are selectively coupled to the output stage. A first input voltage source is $+V_H$, as described above. A second input voltage source is of a like polarity to the first input voltage source, but of a lower magnitude. The second input voltage source is $+V_L$, and for a particular 2 H application, may be set at $+15$ volts. A third input voltage source is $-V_H$ as described above. A fourth input voltage source is of a like polarity to the third input voltage source, but of a lower magnitude. The fourth input voltage source $-V_L$ may be set for $-15$ volts.

A first switchable voltage regulator 11, described in more detail later on, is formed by transistor Q3, resistors R2 and R3 and diode D1. The lower magnitude input voltage source $+V_L$ is automatically coupled to the voltage stage 16 in a low voltage mode and the voltage regulator 11 automatically couples the high magnitude voltage input source $+V_H$ to the output stage 16 in a high voltage mode.

Similarly, a second switchable voltage regulator 13 is formed by transistor Q6, resistors R10 and R11 and diode D8. The lower magnitude, negative polarity voltage source $-V_L$ is automatically coupled to the output stage in a low voltage mode and the voltage regulator 13 automatically couples the high magnitude negative polarity voltage source $-V_H$ to the output stage in a further high voltage mode. The first and second voltage regulators are operable independently of one another. However, as the first regulator is switched on in response to positive excursions of the output signal $V_{OUT}$, and the second regulator is switched on in response to negative excursions of the output signal $V_{OUT}$, only one of the two high magnitude voltage sources will be coupled to the output stage 16 through one of the voltage regulators at one time.

With reference to the positive polarity input voltage sources, diode D2 will be forward biased, and diode D1 will be reverse biased, in the low voltage mode. When diode D1 is reverse biased, transistor Q3 is turned off. This effectively isolates the high voltage source from the output stage when the low voltage input source is coupled to the output stage in the low voltage mode.

In the high voltage mode, diode D1 will be forward biased and diode D2 will be reverse biased. When diode D1 is forward biased, transistor Q3 will conduct, applying regulated high voltage to the collector of transistor Q4. The reverse bias of diode D2 will effectively isolate the low voltage input source $+V_L$ from the high voltage input source in the high voltage mode.

The negative polarity input voltage sources are isolated from one another in an analagous fashion by diodes D7 and D8. When diode D7 is forward biased and diode D8 is reverse biased, the lower magnitude voltage source $-V_L$ will be coupled to the output stage and the high magnitude voltage source $-V_H$ will be effectively isolated. Conversely, when diode D7 is reverse biased and diode D8 is forard biased, input voltage source $-V_H$ will be coupled to the output stage, and input voltage source $-V_L$ will be isolated therefrom.

The level of the output voltage at which the first and second voltage regulators, including transistors Q3 and Q6 respectively, effect a change between the low and high voltage modes, respectively, is determined by respective biasing circuits. A first biasing network or circuit for the positive polarity voltage source is formed by transistor Q7, diodes D3 and D4, resistor R5 and capacitor C1. The biasing network or circuit for the negative polarity voltage sources is formed by transistor Q8, diodes D5 and D6, resistor R6 and capacitor C2.

Whenever the output voltage $V_{OUT}$ is lower in magnitude than the lower supply voltages $+V_L$, $-V_L$, the output stage of the amplifier formed by resistors Q4 and Q5 is coupled to the low voltage input sources, and operates in a conventional fashion and with a substantially linear response. However, as the magnitude of the output voltage $V_{OUT}$ increases, one of the first or second switchable voltage regulators decouples the low voltage input source from stage 16 and couples its respective high voltage input source to stage 16 in order to supply sufficient power to drive the increasing output voltage. The biasing networks form a means for directly sensing the output voltage to anticipate the need for high voltage and generating a high voltage demand control signal for operating the first and second switchable voltage regulators.

Capacitors C1 and C2 are charged to a constant voltage level riding above and below the output voltage respectively. This voltage level is set at 4 volts by the rated voltage of Zener diodes D4 and D5. The biasing network including transistor Q7 maintains the constant voltage across capacitor C1 and the biasing network including transistor Q8 maintains the biasing voltage across capacitor C2. Accordingly, the voltage level at the junction of the emitter of transistor Q7 and the positive terminal of capacitor C1 will be equal to the output voltage $V_{OUT}$ plus the voltage across the capacitor C1, denoted as $V_{C1}$. Conversely, the voltage level at the junction of the emitter of transistor Q8 and the negative terminal of capacitor C2 will be the output voltage $V_{OUT}$ minus the voltage across capacitor C2, denoted as $V_{C2}$.

When the output voltage is relatively low, and of a positive polarity, for example 6 volts, the voltage at the emitter of transistor Q3 is approximately one diode drop below the $+15$ volt low voltage supply and the voltage at the anode of diode D1 is approximately 4 volts above the output voltage, that is, approximately 10 volts. Transistor Q3 is cut off because diode D1 and the base-emitter junction of Q3 are reverse biased. When the output voltage approaches 11 volts plus one diode drop, the voltage at the positive terminal of capacitor C1 starts forward biasing diode D1 and the base-emitter junction of transistor Q3. When the forward biasing of the base-emitter junction of transistor Q3 is established, transistor Q3 turns on and couples the output stage to the high input voltage source, $+50$ volts. The voltage at the collector of transistor Q4 is therefore high enough to reverse bias diode D2, so as to effectively isolate the low voltage input source when the high input voltage source is coupled in the high voltage mode.

In the high voltage mode, the emitter of transistor Q3 will be at a voltage level which is approximately equal to the output voltage $V_{OUT}$ plus 4 volts, minus two diode drops. The diode drops are across diode D1 and the base-emitter function of transistor Q3. If the diode drops are approximately 0.8 volts each, the voltage at the emitter of transistor Q3, which is also the effective collector supply voltage for transistor Q4, will vary directly with the output voltage, and will be approximately 2.4 volts greater than the output voltage. The maximum will be 50 volts, less the voltage drop across the collector-emitter junction of transistor Q3. This arrangement assures that the output stage will always have a large enough voltage source available, without forcing either of transistors Q4 or Q5 into saturation. It is for this reason that transistor Q3 acts as a voltage regulator, rather than merely as a switch. Transistor Q3 acts as an emitter-follower voltage regulator in the sense that it maintains the collector voltage applied to output stage 16 at a voltage $V_{OUT}+V_{C1}-2V_{be}$. Thus the collector supply voltage for Q4 tracks or follows the voltage level Vout. The voltage regulation demonstrates another inventive aspect of this invention. The substantially linear response of the output stage is maintained at virtually all times, essentially irrespective of the low or high voltage mode of operation, even when transistors Q3 or Q6 go into saturation at peak voltage demand.

The capacitors C1 and C2 are not charged when the output voltage exceeds the low voltage supply. However, during the high voltage mode, the charge across capacitor C1 is sufficient to maintain adequate base drive to transistor Q3 during the time transistor Q3 is turned on. The same is true for capacitor C2 and transistor Q6. When the output voltage falls below 11 volts plus one diode drop, diode D1 becomes reverse biased as diode D2 becomes forward biased, thus turning off transistor Q3 and coupling the low voltage supply to the output stage.

The charge across capacitor C1 or C2 may be chosen so as to minimize operating time in the high voltage mode, without unduly delaying the switch-over from low to high input voltage sources. A lag in available high voltage power to the output stage would result in the voltage output having insufficient power to provide the necessary yoke coil correction signal or for timely retrace. It may be appreciated, therefore, that the voltage at the Junction of the emitter of transistor Q7 and the positive terminal of capacitor C1 defines a high voltage demand control signal level for operating the first switchable voltage regulator, which is embodied by transistor Q3 and diode D1.

The operation of the negative polarity biasing network of the amplifier in response to an output voltage with a large negative excursion is analagous to that of the positive polarity biasing network described above. Whenever the magnitude of the output voltage is less than 11 volts plus one diode drop, diode D7 will be forward biased, diode D8 will be reverse biased, transistor Q6 will be turned off and the low voltage supply $-V_L$ will be coupled to the output stage. Whenever the magnitude of the output voltage exceeds 11 volts plus one diode drop, during a negative excursion, diode D7 will become reverse biased, diode D8 will become forward biased, transistor Q6 will be turned on and regulated high magnitude voltage from source $-V_H$ will be coupled to the output stage. The voltage level across capacitor C2 will be a function of the voltage rating of Zener diode D5. The voltage at the junction of the emitter of transistor Q8 and the negative terminal of capacitor C2 defines a further high voltage demand control signal for operating the second switchable voltage regulator.

In an alternative arrangement, the biasing networks 22 may omit their respective transistor and diode for charging the respective capacitors C1 and C2 from the low voltage sources. Instead, the capacitors may be charged from the high voltage sources, eliminating the need for transistors Q7 and Q8 and diodes D3 and D6. More particularly, the biasing network associated with the positive polarity voltage sources may comprise a capacitor in parallel with a zener diode. The capacitor should be large enough to maintain drive to transistor Q3 in the high voltage mode, as in the illustrated circuit. The junction of the anode of the zener diode and the capacitor may be coupled to and directly sense the output voltage as in the illustrated embodiment. However, the junction of the cathode of the zener diode and the capacitor may be coupled to the base of transistor Q3, through resistor R3 and diode D1, and to one end of a further resistor. Resistor R3 should have a low enough resistance to maintain drive of transistor Q3 in the high voltage mode, as in the illustrated circuit. The other end of the further resistor may be coupled to the high voltage source. The further resistor provides a current path for charging the capacitor during the low voltage mode and may be, for example, 10 kilohm. In the biasing network associated with the negative polarity voltage sources, the polarity of the zener diode is reversed. Otherwise, the biasing networks are the same.

This arrangement may be expected to dissipate a little more power through the further resistor than the illustrated arrangement dissipates. However, several component parts may be eliminated. Operation is the same, insofar as the high voltage is regulated by a signal which varies directly with the output signal, the voltage regulators being switched on responsive to a level shift of the output voltage resulting from the charge across the capacitors.

Advantageously, even for a 2H system, operation of the amplifier during trace occurs substantially in the low voltage mode and operation in the high voltage mode is substantially limited to the retrace interval. Further, by applying the high voltage level to convergence yoke Y1 during retrace, the amplifier is well able to assure that retrace occurs in the short time interval which is available during 2H scanning, which is approximately 6 microseconds. Moreover, switching between voltage modes does not adversely affect the linear response of the output stage even during retrace.

Figure 4:
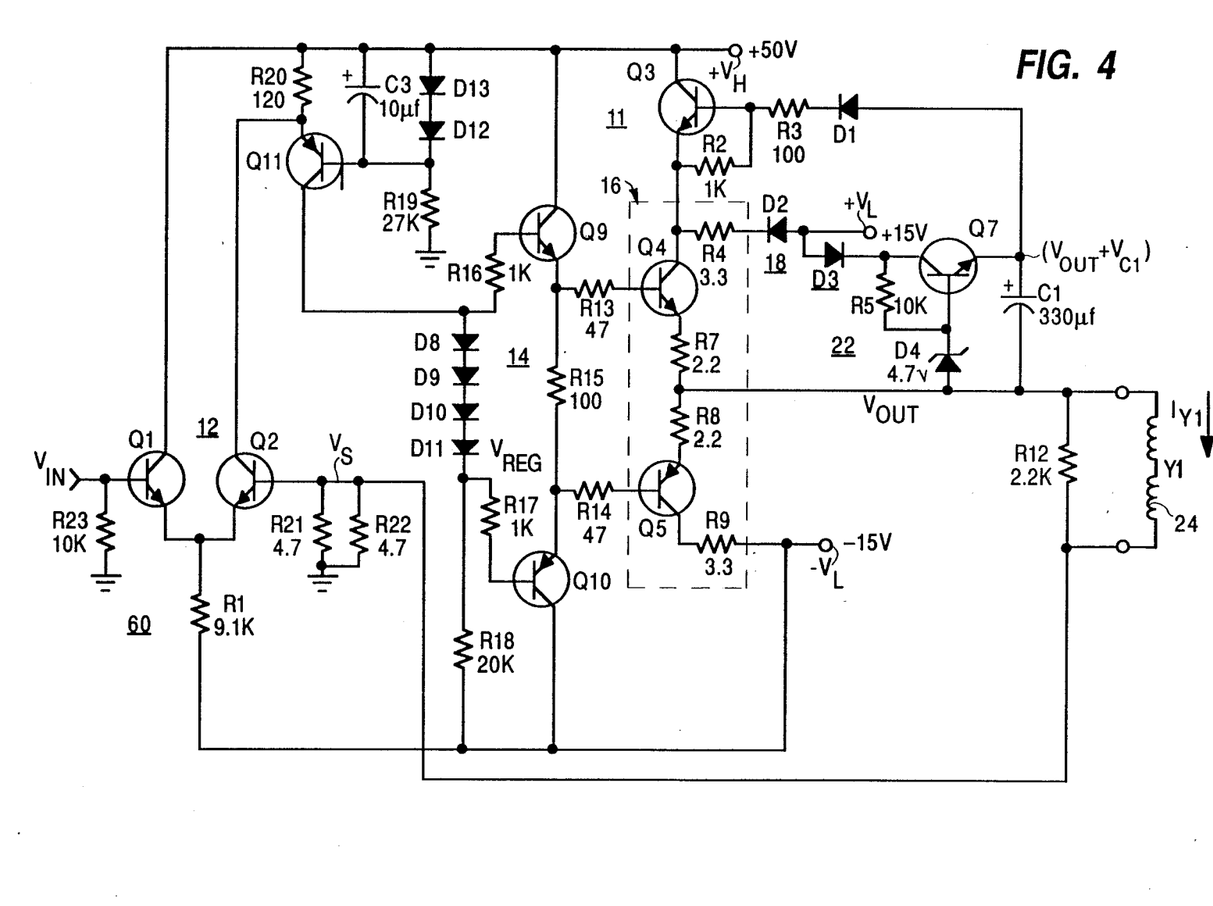
FIG. 4 is a circuit diagram for implementing the amplifier shown in FIG. 2.
Figure 5:
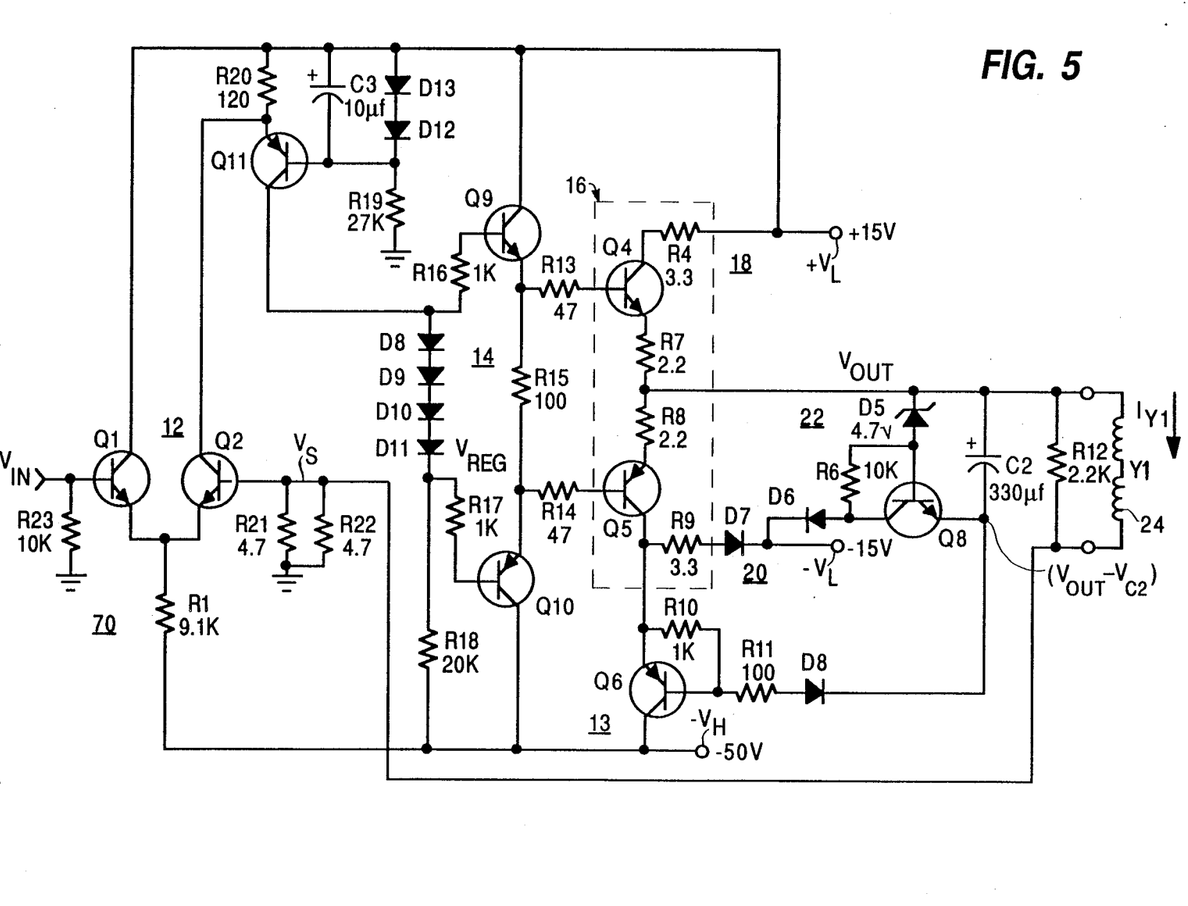
FIG. 5 is a circuit diagram for implementing an amplifier of an asymmetric form opposite to that shown in FIG. 2; and, FIG. 6 is a waveform diagram illustrating output voltage and yoke coil current for the amplifier shown in FIG. 5.

If it is determined that a symmetric amplifier is not necessary for a particular convergence coil, the circuit of FIG. 3 may be modified for removal of either of the high input voltage sources as appropriate as shown in FIGS. 4 and 5.

The amplifier 60 shown in FIG. 4 is an unbalanced amplifier, corresponding to the amplifier shown in FIG. 2. The voltage biasing circuit, including transistor Q8, diodes D5 and D6, resistor R6 and capacitor C2, has been eliminated. The second switchable voltage regulator corresponding to transistor Q6, diode D8 and resistors R10 and R11, has been eliminated. The isolating means embodied by diode D7 has been eliminated and the high magnitude negative voltage source has been eliminated. Accordingly, the low magnitude low voltage source $-V_L$ is coupled directly to the output stage, through resistor R9 and resistor R1. It can be seen that the low magnitude negative voltage $-V_L$ will be coupled to the output stage in both low and high voltage modes.

Amplifier 70 shown in FIG. 5 provides for low and high voltage modes of operation for negative excursion output voltages, but not for positive polarity output voltages. In this case, the biasing network, including transistor Q7, diodes D3 and D4, resistor R5 and capacitor C1, has been eliminated. The first switchable voltage regulator including transistor Q3, diode D1 and resistors R3 and R2, has been eliminated. The isolating means embodied by diode D2 and the positive high voltage source have also been eliminated. Accordingly, the positive low voltage input source will be directly coupled to the output stage through resistor R4 in both low and high voltage modes.

Figure 6:
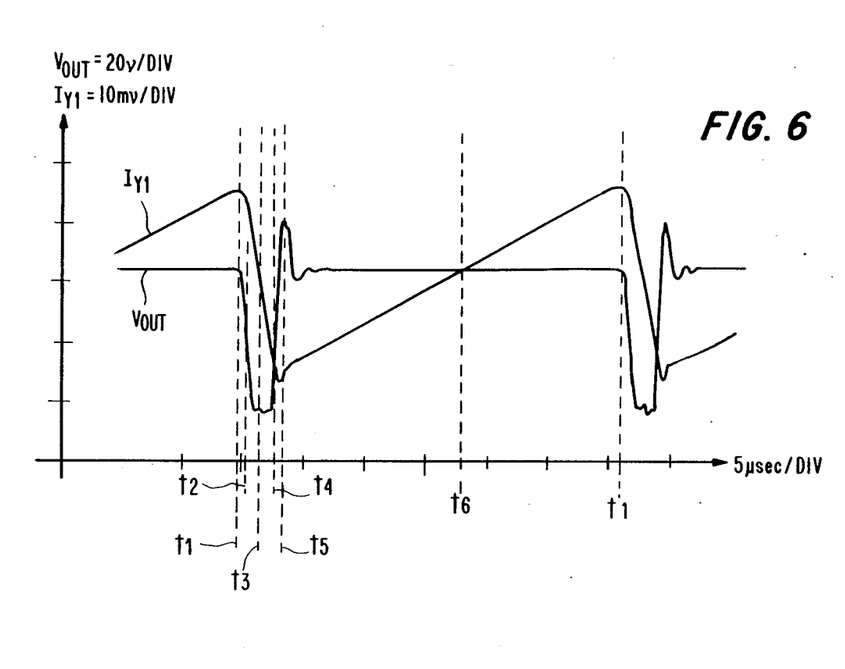

The waveforms shown in FIG. 6 are illustrative of the output voltage $V_{OUT}$ and the current $I_{Y1}$ flowing through the coil of yoke Y1 of FIG. 5. It can be seen that the output voltage approaches the level of the negative polarity high voltage source but does not approach the level of the positive polarity high voltage source. Such an output voltage waveform may be driven by an asymmetric amplifier as shown in FIG. 5. A ramp-shaped correction waveform through the coil, as shown, is the most demanding with respect to switching response of the amplifier.

As the trace interval ends, shortly prior to time t1, transistor Q4 of FIG. 5 is on, transistor Q5 is off and transistor Q6 is off. The retrace interval begins at time t1, and the output voltage falls sharply. At time t2, when $V_{OUT}$ is approximately $-11$ volts, transistor Q6 turns on, initiating the high voltage mode. Current $I_{Y1}$ also drops sharply, but remains positive. At time t3, current $I_{Y1}$ falls below zero, and becomes more negative. Transistor Q4 turns off and transistor Q5 turns on. At time t4, when the magnitude of $V_{OUT}$ becomes less negative than approximately $-11$ volts, transistor Q6 turns off. Retrace is completed by time t5, and transient conditions in the amplifier have an opportunity to settle down before the next trace begins shortly after time t5. The output voltage drives the linear ramp current through the coil. When the current crosses zero at time t6, becoming positive, transistor Q5 turns off and transistor Q4 turns on again.

It will be appreciated by those skilled in the art that, typically, a multi-amplifier circuit for convergence yokes will include one or more balanced or symmetric amplifiers as shown in FIG. 3 and one or more unbalanced amplifiers as shown in FIGS. 4 and/or 5. This arrangement provides for maximum efficiency and minimum input power supply requirements. Moreover, and to the extent that may be warranted by the particular waveform needed to drive a particular deflection coil, the high voltage demand control signal may be set by predetermining the charge across capacitor C1 or capacitor C2. Those signals having faster rise times might require a higher voltage across the respective capacitor, in order to ensure timely switching from the low to the high voltage mode. Conversely, signals known to have slower rise times can have lower voltage levels set for capacitors C1 or C2, to enable the amplifier to operate in the low voltage mode for a longer period of time, relative to the high voltage mode.

The resulting arrangement is flexible and efficient, without sacrificing reliability or image quality.

What is claimed is:

1. A dual source amplifier and deflection coil circuit, comprising:
   a deflection coil for a cathode ray tube;
   a linear gain stage for generating an output voltage for driving the deflection coil, coupled to a first source of a first voltage level in a low voltage mode of operation;
   a second source of a second voltage level of a higher magnitude than the first voltage level and of like polarity;
   means for anticipating high level output voltage demand by monitoring the output voltage and generating a control signal related to the output voltage; and,
   a voltage regulator responsive to the control signal and coupled to the second voltage source and the gain stage, for applying regulated high voltage to the gain stage during the high level output voltage demand, the regulated high voltage, when applied, varying in accordance with the output voltage and maintaining substantially linear operation of the gain stage.

2. The circuit of claim 1, wherein the output voltage and a first predetermined voltage level are combined to develop the control signal for the voltage regulator.

3. The circuit of claim 2, wherein the control signal is a sum of the output voltage and the first predetermined voltage level; and, the control signal is an input control voltage for the voltage regulator.

4. The circuit of claim 3, wherein the sum of the output voltage and the first predetermined voltage level is compared to a second predetermined voltage level for enabling operation of the voltage regulator.

5. A dual source amplifier and deflection coil circuit, comprising:
   a deflection coil for a cathode ray tube;
   a linear gain stage for generating an output voltage for driving the deflection coil, coupled to a first source of a first voltage level in a low voltage mode of operation;
   a second source of a second voltage level of a higher magnitude than the first voltage level and of like polarity;
   means for anticipating high level output voltage demand by monitoring a combination of the output voltage and a first predetermined voltage level;
   a bias circuit for developing the first predetermined voltage level, comprising; a capacitor; means for charging the capacitor; and, a zener diode for limiting the charge on the capacitor; and,
   a voltage regulator, coupled to the anticipating means, the second voltage source and the gain stage, for applying regulated high voltage to the gain stage during the high level output voltage demand, the regulated high voltage varying in accordance with the output voltage and maintaining substantially linear operation of the gain stage.

6. A dual source amplifier and deflection coil circuit, comprising;
   a deflection coil for a cathode ray tube;
   a linear gain stage for generating an output voltage for driving the deflection coil, coupled to a first source of a first voltage level in a low voltage mode of operation;
   a second source of a second voltage level of a higher magnitude than the first voltage level and of like polarity;
   means for anticipating high level output voltage demand by monitoring the output voltage;
   a voltage regulator, coupled to the anticipating means, the second voltage source and the gain stage, for applying regulated high voltage to the gain stage during the high level output voltage demand, the regulated high voltage varying in accordance with the output voltage and maintaining substantially linear operation of the gain stage; and,
   the anticipating means comprises: a zener diode; a transistor, collector coupled to the first voltage source, base coupled to the zener diode and emitter coupled to the voltage regulator; and, a capacitor coupled in parallel with the emitter and the zener diode, the output voltage being fed directly to the junction of the zener diode and the capacitor an input control signal for the voltage regulator being developed at the junction of the emitter and the capacitor.

7. The circuit of claim 6, wherein the voltage regulator comprises:
   a diode;
   a second transistor, base coupled to the cathode of the diode, collector coupled to the second voltage source and emitter coupled to the gain stage, the regulated high voltage being developed at the emitter of the second transistor and being supplied and modulated according to the control signal, applied through the diode.

8. The circuit of claim 1, wherein the voltage regulator comprises:
   a diode;
   a transistor, base coupled to the cathode of the diode, collector coupled to the second voltage source and emitter coupled to the gain stage, the regulated high voltage being developed at the emitter of the transistor and being supplied and varied according to the control signal from the anticipating means applied through the diode.

9. The circuit of claim 8, wherein the anticipating means comprises:
   a zener diode;
   a second transistor, collector coupled to the first voltage source, base coupled to the zener diode and emitter coupled to the voltage regulator; and,
   a capacitor coupled in parallel with the emitter of the second transistor and the zener diode, the output voltage being fed directly to the junction cf the zener diode and the capacitor and the control signal for the voltage regulator being developed at the junction of the emitter of the second transistor and the capacitor.

10. The circuit of claim 1, further comprising means for isolating the first voltage source from the regulated high voltage.

11. The circuit of claim 1, further comprising a third source for a third voltage level of an opposite polarity coupled to the gain stage during both the low voltage mode and during high voltage demand.

12. The circuit of claim 11, further comprising:
   a fourth source for a fourth voltage level of a higher magnitude than the third voltage level and of like polarity to the third voltage level;

a further means for anticipating a further high voltage demand by monitoring the output voltage and generating a further control signal related to the output voltage and, a further voltage regulator responsive to the further control signal and coupled to the fourth voltage source and the gain stage, for applying a further regulated high voltage of the opposite polarity to the gain stage during the further high level voltage demand, the further regulated high voltage, when applied, varying in accordance with the output voltage.

13. A dual source amplifier and deflection coil circuit, comprising:

a deflection coil for a cathode ray tube;

a linear gain stage for generating an output signal for driving the deflection coil, coupled to a first magnitude level voltage source in a low voltage mode of operation;

a second magnitude level voltage source of a higher level than the first voltage source and of like polarity;

means for monitoring the output signal and generating a high voltage mode control signal which varies with the output signal; and, a voltage regulator responsive to the control signal and coupled to the second voltage source and the gain stage for applying a regulated high voltage to the gain stage during a high voltage mode of operation, the regulated high voltage, when applied, varying with the output signal and maintaining substantially linear operation of the gain stage.

14. The circuit of claim 13, wherein the voltage regulator comprises:

a diode;

a transistor, base coupled to the cathode of the diode, collector coupled to the second voltage source and emitter coupled to the gain stage, the regulated high voltage being developed at the emitter of the transistor and being supplied and varied according to the control signal from the monitoring means applied through the diode.

15. The circuit of claim 13, wherein the monitoring means comprises:

means for sensing the output signal; and, means for level shifting the output signal to define the control signal, the voltage regulator applying the regulated high voltage when the control signal has a magnitude greater than a predetermined magnitude.

16. The circuit of claim 14, wherein the monitoring means comprises:

a zener diode;

a second transistor, collector coupled to the first voltage source, base coupled to the zener diode and emitter coupled to the diode of the voltage regulator; and, a capacitor coupled in parallel with the emitter of the second transistor and the zener diode:, the output signal being fed directly to the junction of the zener diode and the capacitor and the control signal for the voltage regulator being developed at the junction of the emitter of the second transistor and the capacitor.

17. A convergence control circuit, comprising:

a convergence yoke having a deflection coil; means for generating a convergence correction deflection waveform; and, a dual source amplifier coupled to the deflection coil and the waveform generating means, the amplifier comprising:

a linear output stage for generating an output signal for driving the deflection coil, coupled to a first source of a first voltage level in a low voltage mode of operation;

a second source of a second voltage level of a higher magnitude than the first voltage level and of like polarity;

means for anticipating high voltage demand by level shifting the output signal by a first predetermined voltage level and comparing the magnitude of the level shifted signal to a second predetermined voltage level; and, a voltage regulator, coupled to the anticipating means, the second voltage source and the output stage, for applying a regulated high voltage to the output stage in a high voltage mode of operation when the magnitude of the level shifted signal exceeds the second predetermined voltage level, the regulated high voltage varying with the output signal and maintaining substantially linear operation of the output stage; and, a third source of a third voltage level, of a polarity opposite to the polarity of the first and second voltage sources, coupled to the output stage in both the low and high voltage modes.

18. The convergence control circuit of claim 17, comprising:

a plurality of convergence yokes, each having at least one deflection coil;

means for generating a convergence correction deflection waveform for each of the deflection coils; and, a plurality of the dual source amplifiers, one for driving each of the deflection coils.

19. The convergence control circuit of claim 18, wherein at least one of the dual source amplifiers comprises:

a fourth source of a voltage level of a higher magnitude than the third voltage level and of like polarity;

a further means for anticipating high voltage demand by level shifting the output signal by a third predetermined voltage level and comparing the magnitude of the further level shifted signal to a fourth predetermined voltage level; and, a further voltage regulator, coupled to the further anticipating means, the fourth voltage source and the output stage for applying a further regulated high voltage to the ouput stage in a further high voltage mode of operation when the magnitude of the further level shifted signal exceeds the fourth predetermined voltage level, the further regulated high voltage varying with the output signal and maintaining substantially linear operation of the output stage.

20. A dual source amplifier and deflection coil circuit, comprising a defection coil for a cathode ray tube;

a linear gain stage for generating an output signal for driving the deflection coil, having a power supply input terminal;

a first magnitude level voltage source coupled to the supply terminal in a low voltage mode of operation;

a second magnitude level voltage source of a higher level than the first voltage source and of like polarity;

means for monitoring the output signal and generating a high voltage mode control signal which varies with the output signal; and, an emitter-follower amplifier coupled to the second voltage source, receiving the control signal as an input and generating a regulated high voltage as an output to the supply terminal of the gain stage during a high voltage mode of operation, the emitterfollower amplifier being coupled to the gain stage for applying the regulated high voltage to the gain stage in the high voltage mode of operation when the control signal has a magnitude greater than a predetermined voltage level, the regulated high voltage, when supplied to the gain stage, varying with the output signal and maintaining substantially linear operation of the gain stage.

21. The circuit of claim 20, wherein the control signal is developed by summing the output signal and a further predetermined voltage level.

22. The circuit of claim 21, wherein the emitter-follower amplifier has a gain of approximately one, the regulated high voltage having a magnitude between the magnitude of the output signal and the magnitude of the control signal.

* * * * *